(12) United States Patent
Chaleix et al.

(10) Patent No.: US 10,612,144 B2
(45) Date of Patent: Apr. 7, 2020

(54) METAL SHEET TREATMENT METHOD FOR REDUCING BLACKENING OR TARNISHING DURING THE STORAGE THEREOF AND METAL SHEET TREATED WITH THIS METHOD

(71) Applicant: ArcelorMittal, Luxembourg (LU)

(72) Inventors: Daniel Chaleix, Verny (FR); Christian Allely, Metz (FR); Maxime Monnoyer, Audun-le-Roman (FR); Pascale Feltin, Saint Privat la Montagne (FR)

(73) Assignee: ArcelorMittal, Luxembourg (LU)

( * ) Notice: Subject to any disclaimer, the term of this patent is extended or adjusted under 35 U.S.C. 154(b) by 804 days.

(21) Appl. No.: 14/900,820

(22) PCT Filed: Jul. 4, 2014

(86) PCT No.: PCT/IB2014/001271
§ 371 (c)(1),
(2) Date: Dec. 22, 2015

(87) PCT Pub. No.: WO2015/001419
PCT Pub. Date: Jan. 8, 2015

(65) Prior Publication Data
US 2016/0138167 A1    May 19, 2016

(30) Foreign Application Priority Data
Jul. 4, 2013 (WO) .................. PCT/IB2013/001447

(51) Int. Cl.
| | |
|---|---|
| C23C 22/53 | (2006.01) |
| C23C 22/68 | (2006.01) |
| C23C 14/16 | (2006.01) |
| C23C 2/26 | (2006.01) |
| C23C 28/00 | (2006.01) |
| C25D 11/34 | (2006.01) |
| C23C 2/06 | (2006.01) |
| C25D 5/48 | (2006.01) |
| C23C 14/58 | (2006.01) |
| C25D 3/56 | (2006.01) |
| C25D 7/06 | (2006.01) |

(52) U.S. Cl.
CPC .............. *C23C 22/53* (2013.01); *C23C 2/06* (2013.01); *C23C 2/26* (2013.01); *C23C 14/16* (2013.01); *C23C 14/5846* (2013.01); *C23C 22/68* (2013.01); *C23C 28/321* (2013.01); *C23C 28/34* (2013.01); *C25D 5/48* (2013.01); *C25D 11/34* (2013.01); *C25D 3/565* (2013.01); *C25D 7/0614* (2013.01)

(58) Field of Classification Search
CPC .......... C25D 11/34; C25D 3/565; C25D 5/48; C25D 7/0614
USPC ....................................................... 427/343
See application file for complete search history.

(56) References Cited

U.S. PATENT DOCUMENTS

| | | | |
|---|---|---|---|
| 4,088,810 | A | 5/1978 | Lodge |
| 9,745,654 | B2 | 8/2017 | Oh et al. |

FOREIGN PATENT DOCUMENTS

| | | | |
|---|---|---|---|
| CN | 102745737 A | | 10/2012 |
| JP | H07173656 A | | 7/1995 |
| JP | 2001107213 A | | 4/2001 |
| JP | 2005118797 A | * | 5/2005 |
| JP | 2005118797 A | | 5/2005 |
| JP | 2015531817 A | | 11/2015 |
| RU | 2371513 C1 | | 10/2009 |
| WO | 2008102009 A1 | | 8/2008 |

OTHER PUBLICATIONS

Hosking et al., "Corrosion resistance of zinc-magnesium coated steel," Corrosion Science, vol. 49, No. 9, Jul. 19, 2007, pp. 3669-3695.*
Schuerz, S. et al, "Corrosion behaviour of Zn—Al—Mg coated steel sheet in sodium chloride-containing environment", Corrosion Science, Oct. 2009, p. 2355-2363, vol. 51, No. 10, Oxford, GB.
Volovitch P. et al, "Understanding corrosion via corrosion product characterization: I. Case study of the role of Mg alloying in Zn—Mg coating on steel", Corrosion Science, Jun. 2009, p. 1251-1262, vol. 51, No. 6, Oxford, GB.
Prosek T. et al, "Corrosion mechanism of model zinc-magnesium alloys in atmospheric conditions", Corrosion Science, Aug. 2008, p. 2216-2231, vol. 50, No. 8, Oxford, GB.
Volovitch P. et al., "Understanding corrosion via corrosion product characterization: II. Role of alloying elements in improving the corrosion resistance of Zn—Al—Mg coatings on steel", Corrosion Science, Mar. 2011, p. 2437-2445, vol. 53.
Tsujimura T. et al., "Influence of Mg content in coating layer and coating structure on corrosion resistance of hot-dip Zn—Al—Mg alloy coated steel sheet", Proceedings of the Galvatech '01 International Conference on Zinc and Zinc Alloy Coated Steel, Jun. 26, 2001 to Jun. 28, 2001, p. 145-152, Brussels, Belgium.

(Continued)

*Primary Examiner* — Alexander M Weddle
(74) *Attorney, Agent, or Firm* — Davidson, Davidson & Kappel, LLC

(57) ABSTRACT

The present invention provides a metal sheet including a steel substrate coated on at least one face with a coating including from 0.1 to 20% by weight of magnesium, optionally from 0.1 to 20% by weight of aluminum, the balance being zinc, potential impurities linked to the method and optionally one or more additional elements selected from among Si, Sb, Pb, Ti, Ca, Mn, Sn, La, Ce, Cr, Ni, Zr and Bi, the content by weight of each additional element being less than 0.3%. The coating itself is covered by a layer, based on zinc hydroxychloride, having a chlorine coating weight of at least 1 mg/m². The layer does not include hydrozincite or mixed hydroxycarbonates of zinc and aluminum or water-soluble compounds of sodium or potassium. The present invention also provides a method to obtain the metal sheet.

21 Claims, 2 Drawing Sheets

(56) References Cited

OTHER PUBLICATIONS

Kawafuku J. et al., "Properties of zinc alloy coated steel sheets obtained by continuous vapor deposition pilot-line", Proceedings of the 5th Automotive Corr. & Prevention Conference, Oct. 21, 1991 to Oct. 23, 1991, Michigan, U.S., SAE Paper No. 912272, 1991, p. 43-50, Philadelphia, PA.

* cited by examiner

METAL SHEET TREATMENT METHOD FOR REDUCING BLACKENING OR TARNISHING DURING THE STORAGE THEREOF AND METAL SHEET TREATED WITH THIS METHOD

This invention relates to metal sheet comprising a steel substrate coated on at least one of its faces with a metallic coating comprising zinc and magnesium.

BACKGROUND

Metal sheet of this type is intended in particular for the fabrication of automobile parts, although its use is not limited to this application.

Metallic coatings comprising essentially zinc are conventionally used for the effective protection they provide against the corrosion of steels, whether in the automobile industry or in construction, for example. However, these coatings are encountering increasing competition from more effective coatings comprising zinc, magnesium and optionally also aluminum, which are referred to below as ZnMg(Al) coatings.

The addition of magnesium significantly increases the resistance of these coatings to perforating corrosion, which can make it possible to reduce the thickness of the coating or even to maintain the thickness of the coating and increase the guarantee of longer-term protection against corrosion.

Analyses of the corrosion products formed on coatings comprising essentially zinc in comparison with ZnMg(Al) coatings have explained the beneficial effect of magnesium. The publication entitled "Understanding corrosion via corrosion product characterization: II. Role of alloying elements in improving the corrosion resistance of Zn—Al—Mg coatings on steel," P. Volovitch et al. Corrosion Science 53 (2011) 2437-2445, indicates that the ZnMg(Al) coatings have, on the surface, a mixture of corrosion products such as simonkolleite having the formula $Zn_5(OH)_8Cl_2$, $H_2O$, hydrozincite having the formula $Zn_5(CO_3)_2(OH)_6$, zinc hydroxysulfate having the formula $Zn_4SO_4(OH)_6 \cdot xH_2O$, mixed hydroxycarbonates of zinc and aluminum, such as LDH (layered double hydroxide) having the formula $Zn_xAl_y(CO_3)_m(OH)_n \cdot zH_2O$, during their exposure to corrosive atmospheres. In addition, the mostly formed corrosion product at the beginning of the exposure of the coated sheets to a marine atmosphere, i.e. simonkolleite, is indirectly stabilized by the presence of $Mg^{2+}$ ions originating from the partial dissolution of the metal coating. The $Mg^{2+}$ ions indeed react preferentially with the carbonates originating from the dissolution of atmospheric $CO_2$ in the corrosive medium, thereby preventing the simonkolleite from reacting with them and being transformed into hydrozincite or smithsonite, corrosion products that have less effective barrier properties.

It is also known from the publication entitled "Influence of Mg content in coating layer and coating structure on corrosion resistance of hot-dip Zn—Al—Mg alloy coated steel," T. Tsujimura et al., Proceedings of the Galvatech '01 International Conference on Zinc and Zinc Alloy Coated Steel, Brussels, Belgium, Jun. 26-28, 2001, pp. 145-152, and from the publication entitled, "Properties of zinc alloy coated steel sheets obtained by continuous vapor deposition pilot-line," J. Kawafuku et al., Proceedings of the 5th Automotive Corr. & Prevention Conference, Mich., United States, Oct. 21-23, 1991, SAE Paper No. 912272, Philadelphia, 1991, pp. 43-50, that, for certain ZnMg(Al) coating compositions, the specimens of coated metal sheet subjected to a corrosion test containing sodium chloride corrode at the beginning of the test by the appearance of a single corrosion product, simonkoellite, simultaneously with the deposition on the specimens of water-soluble sodium chloride salt (inherent to the corrosive salt used in the corrosion test). This presence of simonkolleite as the single corrosion product seems to contribute to the better corrosion resistance of these specific ZnMg(Al) coatings.

Therefore, a knowledge of the nature of the corrosion products that are formed on the coatings exposed to various ambient media can be used to guide a manufacturer in the selection of the elements to be added to zinc and their respective proportions to obtain coatings that offer the most protection.

However, this optimization of ZnMg(Al) coatings does not prevent a slight alteration of the surface resulting from the storage of the coils of metal sheet with surface coatings of this type.

Coils of metal sheet are conventionally stored by customers before they are used. The coils may therefore have to remain in storage buildings for several months, where they are subjected to severe variations of atmospheric conditions. During this storage, the surface must not be modified, and in particular, corrosion must not develop. For this purpose, standard galvanized products, i.e. those whose coatings comprise essentially zinc, are coated with a protective oil.

However, it has been observed that when the ZnMg(Al) metal sheet is oiled before coiling like the standard galvanized sheet, a slight surface oxidation that modifies the interaction of the light with the surface, thus modifying its visual appearance, can occur if the protective oil suffers de-wetting.

For coatings that comprise zinc and magnesium, black spots appear in the areas of de-wetting. This phenomenon is called blackening. For coatings that comprise zinc, magnesium and aluminum, the entire surface that is not coated with oil tarnishes. This phenomenon is called tarnishing.

In addition, the use of a temporary protective oil is rather constraining because, on one hand, oil tends to contaminate the working environment as well as the tools used to cut and shape the coils of metal sheet, and on the other hand a degreasing process is frequently necessary in a subsequent step in the fabrication of the parts originating from these coils.

BRIEF SUMMARY

Therefore, there is a need to develop a system of temporary protection for these coatings, in particular with regard to the phenomena of blackening and tarnishing, in the form of a system that is effective even in the absence of temporary protective oil.

For this purpose, the present invention provides a treatment method for a moving metal strip 3 comprising the following steps:

- a strip 3 of steel coated on at least one of its faces 5 with a coating 7 is provided, the coating 7 comprising from 0.1 to 20% by weight of magnesium, optionally from 0.1 to 20% by weight of aluminum, the balance being zinc, potential impurities linked to the method and optionally one or more additional elements selected from among Si, Sb, Pb, Ti, Ca, Mn, Sn, La, Ce, Cr, Ni, Zr and Bi, the content by weight of each additional element being less than 0.3%,
- an aqueous treatment solution comprising at least 0.01 mol/L of zinc chloride and comprising no sodium chloride or potassium chloride is applied to the coating 7 by simple contact, wherein the temperature, the contact time with the coating 7 and the concentration of chloride ions Cl⁻ are adapted to form on the coating 7 a layer 13, based on zinc hydroxychloride, having a chlorine coating weight of at least 1 mg/m², wherein the layer 13 comprises neither hydrozincite nor mixed hydroxycarbonates of zinc and aluminum.

The method claimed by the invention can also have the following characteristics, considered individually or in combination:
  it comprises an additional drying step subsequent to the application of the aqueous treatment solution,
  the aqueous treatment solution also contains $Mg^{2+}$ ions in a concentration between $5 \cdot 10^{-5}$ and 0.25 mol/L,
  the $Mg^{2+}$ ions are added to the aqueous solution in the form of magnesium chloride,
  the aqueous treatment solution contains no chloride salt other than zinc chloride and/or magnesium chloride.

The present invention also provides a method for the treatment of a metal strip 3 comprising the following steps:
  a strip 3 of steel coated on at least one of its faces 5 with a coating 7 is provided, the coating 7 comprising from 0.1 to 20% by weight of magnesium, optionally from 0.1 to 20% by weight of aluminum, the balance being zinc, potential impurities linked to the method and optionally one or more additional elements selected from among Si, Sb, Pb, Ti, Ca, Mn, Sn, La, Ce, Cr, Ni, Zr and Bi, the content by weight of each additional element being less than 0.3%,
  an aqueous treatment solution having a pH between 7 and 10 comprising at least 0.01 mol/L of chloride ions Cl⁻ is applied under anodic polarization to the coating 7, the quantity of electrical charges circulating during the treatment being adapted to form on the coating 7 a layer 13, based on zinc hydroxychloride, having a chlorine coating weight of at least 1 mg/m², wherein the layer 13 comprises neither hydrozincite nor mixed hydrocarbonates of zinc and aluminum,
  the treated surface is rinsed.

This method claimed by the invention can also comprise an additional drying step subsequent to the rinsing.

The present invention further provides a metal sheet 1 comprising a substrate 3 of steel coated on at least one of its faces 5 with a coating 7 comprising from 0.1 to 20% by weight of magnesium, optionally from 0.1 to 20% by weight of aluminum, the balance being zinc, potential impurities linked to the method and optionally one or more additional elements selected from Si, Sb, Pb, Ti, Ca, Mn, Sn, La, Ce, Cr, Ni, Zr and Bi, whereby the content by weight of each additional element is less than 0.3%, the coating 7 itself being covered by a layer 13, based on zinc hydroxychloride, having a chlorine coating weight of at least 1 mg/m², whereby the layer 13 contains neither hydrozincite nor mixed hydroxycarbonates of zinc and aluminum, nor water-soluble compounds of sodium or potassium.

The metal sheet according to the invention can also include the following characteristics, considered individually or in combination:
  the coating 7 also comprises aluminum in a content by weight between 0.1 and 20%,
  the coating 7 also comprises between 14 and 18% by weight of magnesium, the balance being zinc,
  the chlorine coating weight is less than 70 mg/m²,
  the chlorine coating weight is between 8 and 60 mg/m²,
  the layer 13 is distributed uniformly over the entire surface of the coating 7,
  the layer 13 does not comprise any water-soluble calcium compound,
  the layer 13 does not comprise any water-soluble compound other than zinc and/or magnesium.

BRIEF DESCRIPTION OF THE DRAWINGS

Additional characteristics and advantages of the invention will be indicated in the following description, which is given solely by way of a non-limiting example.

The invention will be illustrated here by the following non-limiting examples and with reference to the accompanying figures, in which.

DETAILED DESCRIPTION

Figure 1:
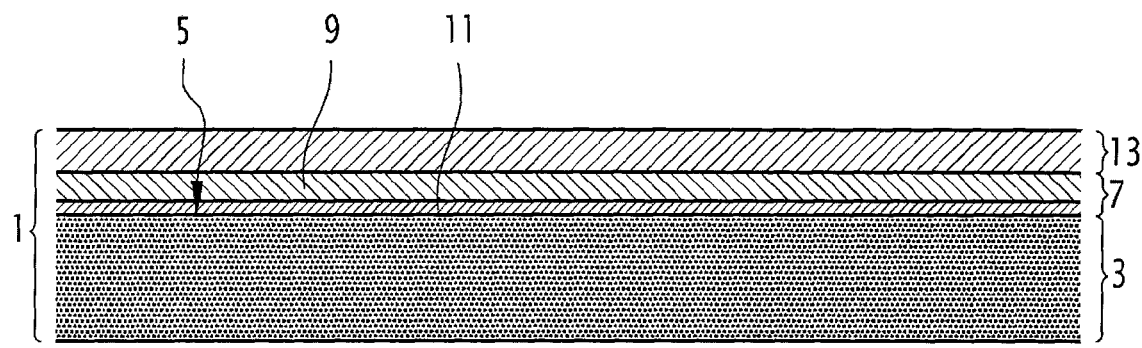
FIG. 1 is a schematic view in cross section illustrating the structure of a sheet according to the invention.

The metal sheet in FIG. 1 comprises a steel substrate 3, preferably hot-rolled then cold-rolled. The substrate 3 is covered on one face 5 by a coating 7, which is itself covered by a temporary protection layer 13. Although FIG. 1 shows the coating 7 and the temporary protection layer 13 only on one face of the substrate, it is understood that they can be present on both faces of the substrate. It should be noted that for purposes of illustration, the relative thicknesses of the substrate 3 and of the different layers that cover it are not drawn to scale in FIG. 1.

The metal sheet 1 and the substrate 3 can be both in the form of a strip, coiled or uncoiled, and in the form of a sample, e.g. taken from the strip by cutting, punching or any other suitable technique.

First of all, the coating 7 comprises at least one layer 9 comprising at least zinc and magnesium. Preferably, the layer 9 comprises from 0.1 to 20% by weight of magnesium, optionally from 0.1 to 20% by weight of aluminum, the balance being zinc, potential impurities linked to the method and optionally one or more additional elements selected from among Si, Sb, Pb, Ti, Ca, Mn, Sn, La, Ce, Cr, Ni, Zr and Bi, wherein the content by weight of each additional element is less than 0.3%.

The layer 9 is preferably constituted of 0.1 to 20% by weight of magnesium, the balance being zinc and at least one element to be selected from among 0.1 to 20% by weight of aluminum, the impurities linked to the method and the additional elements being selected from among Si, Sb, Pb, Ti, Ca, Mn, Sn, La, Ce, Cr, Ni, Zr and Bi, wherein the content by weight of each additional element is less than 0.3%.

With reference to magnesium, below 0.1%, no protective effect against perforating corrosion is apparent. Above 20%, on the other hand, the higher proportion of magnesium would result in an excessively rapid consumption of the coating 7 and therefore in paradoxically degraded anti-corrosion performance.

In one preferred embodiment, the layer 9 contains at least 0.5% by weight of magnesium, preferably at least 2%.

This layer 9 generally has a thickness less than or equal to 20 μm, and its purpose is to protect the substrate 3 against perforating corrosion.

Any suitable means can be used to form the layer 9.

In a first embodiment, the layer 9 is obtained by a vacuum deposition process such as magnetron sputtering or vacuum thermal deposition utilizing the joule effect, by induction or under an electron beam.

In this case, the layer 9 generally comprises only zinc and magnesium, although other elements such as aluminum or silicon can be added, if necessary, to enhance other characteristics of the layer 9 such as its ductility or its adherence to the substrate 3.

When the layer 9 comprises only zinc and magnesium, it is preferable in particular if the layer 9 comprises between 14 and 18% by weight of magnesium, and even better if the majority of the layer 9 corresponds to the intermetallic compound having the formula $Zn_2Mg$, comprising approximately 16% by weight of magnesium, which has a very good resistance to perforating corrosion.

In one variant of this embodiment, magnesium can simply be vacuum deposited on zinc previously deposited by electro-deposition on the substrate 3, followed by a heat treatment to alloy the magnesium and zinc to form the layer 9 comprising zinc and magnesium. In this case, after the heat treatment and as a function of the heat treatment conditions, a portion of the zinc previously deposited by electro-deposition can still be present in the form of a layer 11 of zinc located between the face 5 of the substrate and the layer 9.

In a second embodiment, the layer 9 can be obtained by a hot dip coating process in a bath of molten zinc containing magnesium up to a content of 10% by weight and aluminum up to a content of 20% by weight. The bath can also contain up to 0.3% by weight of optional additive elements such as Si, Sb, Pb, Ti, Ca, Mn, Sn, La, Ce, Cr, Ni, Zr or Bi.

These different elements can make it possible, among other things, to improve the ductility or adhesion of the layer 9 to the substrate 3. A person skilled in the art who is familiar with their effects on the characteristics of the layer 9 will know how to employ them as a function of the additional objective being sought.

Finally, the bath can contain residual elements originating from the ingots melted or resulting from the passage of the substrate 3 through the bath, such as iron in a content up to 0.5% by weight and generally between 0.1 and 0.4% by weight. These residual elements are partly incorporated into the layer 9, in which case they are designated by the term impurities.

Preferably, the layer 9 of this embodiment comprises between 0.1 and 10% by weight of magnesium and between 0.1 and 20% by weight of aluminum. Preferably again, the layer 9 comprises between 2 and 4% by weight of magnesium and between 2 and 6% by weight of aluminum; the composition is then close to that of the ternary eutectic zinc/aluminum/magnesium.

Still with reference to FIG. 1, the coating 7 is covered by a temporary protection layer 13 based on simonkolleite $(Zn_5(OH)_8Cl_2, H_2O)$, which is also called zinc hydroxychloride.

As will be seen in the examples below, the inventors have shown that the presence of a layer 13 makes it possible to improve the resistance to blackening in the case of a coating 7 comprising zinc and magnesium, and to enhance the resistance to tarnishing if the coating 7 comprises zinc, magnesium and aluminum. This increased resistance is particularly useful in the absence of an oil film, for example following a de-wetting of an oil film applied to the coating 7.

This increase in the resistance to blackening and tarnishing is due essentially to the formation of a conversion layer based on simonkolleite.

The layer 13 is obtained by application on the coating 7, optionally after degreasing, of an aqueous treatment solution comprising chloride ions $Cl^-$.

The reactions involved during the application of this aqueous solution on the coating 7 are:

1. Acid attack of the zinc metal, which leads to the formation of $Zn^{2+}$ ions and the alkalinization of the medium: $Zn + 2H_2O \rightarrow Zn^{2+} + 2OH^- + H_2$ 2. Precipitation of zinc hydroxychloride under the effect of the accumulation of $Zn^{2+}$ and $OH^-$ ions in the chloride solution: $5 Zn^{2+} + 2 Cl^- + 8 OH^- \rightarrow Zn_5(OH)_8Cl_2$ Therefore, the layer 13 comprises neither hydrozincite (having the formula $Zn_5(CO_3)_2(OH)_6$) nor mixed hydroxycarbonates of zinc and aluminum, such as the LDH (layered double hydroxides) having the formula $Zn_xAl_y(CO_3)_m(OH)_n \cdot zH_2O$, contrary to what is observed on coatings 7 exposed to a saline atmosphere.

In addition, the layer 13 does not contain any residual water-soluble compound of sodium or potassium, in particular no residual soluble salt of sodium chloride or potassium chloride. The absence of these residual water-soluble compounds improves the resistance to blackening/tarnishing and the resistance to corrosion of the metal sheet 1. Their absence is inherent to the methods according to the invention, as will be described in greater detail below.

Preferably, the layer 13 does not contain any residual water-soluble compound of sodium, potassium or calcium, in particular no residual soluble salt of sodium chloride, potassium chloride or calcium chloride. The additional absence of a residual water-soluble compound of calcium makes it possible to further improve the resistance to blackening/tarnishing and the resistance to corrosion of the metal sheet 1. Its absence is inherent to the variants of the methods according to the invention, as will be described in greater detail below.

More preferably, the layer 13 does not comprise any residual water-soluble compound other than of zinc and/or magnesium, in particular no residual chloride salt other than zinc chloride and/or magnesium chloride. Their absence further improves the resistance to blackening/tarnishing and the resistance to corrosion of the metal sheet 1. Their absence is inherent to variants of the methods according to the invention, as will be explained in greater detail below.

In terms of surface distribution, the layer 13 is distributed uniformly over the entire surface of the coating 7, contrary to what is observed on a coating of this type exposed to a saline atmosphere, for which the development of corrosion products occurs randomly, depending on the presence of surface defects and chlorides. Uniform distribution means that an x-ray fluorescence spectroscopic analysis, by means of a unit having an aperture on the order of 1 cm$^2$, at any point on the surface reveals the presence of the layer 13. The uniformity of the layer 13 is inherent to the fact that the coating 7 is exposed in its entirety to an aqueous treatment solution.

The weight of the layer 13 is expressed by the measurement of the weight of the chlorine layer. This latter is greater than or equal to 1 mg/m$^2$, because below 1 mg/m$^2$, the coverage of the layer 13 thus formed is insufficient to guarantee the absence of blackening/tarnishing during storage.

Preferably, the chlorine coating weight is less than or equal to 70 mg/m². The good performance obtained with coating weights less than 70 mg/m² does not justify any further increase in the coating weight.

Even more preferably, the chlorine coating weight is between 8 and 60 mg/m².

The aqueous treatment solution contains chloride ions $Cl^-$ in a concentration greater than or equal to 0.01 mol/L. These chloride ions can originate in particular from zinc chloride, sodium chloride, potassium chloride or also from calcium chloride, which are cited solely by way of non-restricting examples.

When sodium chloride is used in the aqueous treatment solution, if the sodium chloride concentration is less than 0.58 g/L in the solution, there is little formation of zinc hydroxychloride on the surface. This concentration is equivalent to 0.01 mol/L of $Cl^-$ and, more generally, it means that the concentration of $Cl^-$ ions has to be greater than or equal to 0.01 mol/L, and preferably greater than or equal to 0.07 mol/L.

In addition, the concentration of chloride ions is preferably less than or equal to 1 mol/L. When sodium chloride is used in concentrations greater than 58 g/L, there is a decrease in performance in terms of the formation of the layer 13.

In one preferred embodiment, the aqueous treatment solution also comprises $Zn^{2+}$ ions in a concentration greater than or equal to 0.005 mol/L, which makes it possible to obtain a more uniform deposit. In this case, the aqueous treatment solution is prepared, for example, by dissolving zinc chloride in pure water.

In one preferred embodiment, the aqueous treatment solution also contains $Mg^{2+}$ ions. As indicated above, these ions contribute to the enhanced stabilization of the zinc hydroxychloride layer formed by reacting with the carbonates instead of the simonkolleite. The addition of $Mg^{2+}$ ions to the aqueous treatment solution in addition to the $Mg^{2+}$ ions originating from the partial dissolution of the coating 7 makes it possible to postpone even longer the risk of conversion into carbonate of the layer 13 during storage of the treated metal sheet. Preferably, the $Mg^{2+}$ ions are added to the aqueous solution in the form of magnesium sulfate or magnesium chloride. Preferably, the concentration of $Mg^{2+}$ ions is between $5 \cdot 10^{-5}$ and 0.25 mol/L. If a solution of magnesium sulfate is used, the $Mg^{2+}$ will preferably be added so that the molar ratio $Mg^{2+}/Cl^-$ is less than 10% to limit the formation of zinc hydroxysulfate.

If a solution of zinc chloride is used, the $Mg^{2+}$ ions will preferably be added so that the molar ratio $Mg^{2+}/Zn^{2+}$ is close to the molar ratio Mg/Zn of the coating 7. It has also been found that the choice of a molar ratio of this order of magnitude promotes the stabilization of the layer 13.

In one preferred embodiment, the aqueous treatment solution does not contain any chloride salt other than zinc chloride and/or magnesium chloride. By way of non-restricting examples, the aqueous solution does not contain any aluminum chloride, calcium chloride, manganese chloride, iron chloride, cobalt chloride, nickel chloride, copper chloride or tin chloride. The absence of chloride salts other than zinc chloride and/or magnesium chloride makes it possible to prevent the presence of sodium, potassium, calcium and other cations that form residual water-soluble compounds in the layer 13 and consequently alter the resistance to blackening/tarnishing and the resistance to corrosion of the metal sheet 1.

The aqueous treatment solution is preferably applied at the exit of the galvanizing line or at the exit of the vacuum deposition line before any surface oxides develop and modify the surface reactivity of the coating 7.

In a first embodiment of the method to obtain the layer 13, the aqueous treatment solution is applied simply by bringing it into contact with the coating 7, for example by dipping, spraying or coating. Preferably, the aqueous treatment solution is applied to the surface of the coating 7 in the form of a liquid film. In this case, the reactions 1) and 2) described above take place in this liquid film.

In this first embodiment, the pH of the aqueous treatment solution preferably corresponds to the natural pH of the solution, without the addition of bases or acids, i.e. generally between 4 and 7.

Preferably, the aqueous treatment solution is applied over the coating 7 under conditions of temperature, contact time with the coating 7, concentration of $Cl^-$ ions adjusted so that the layer 13 has a chlorine coating weight greater than or equal to 1 mg/m².

The temperature of the aqueous treatment solution is also preferably between 20 and 60° C. and the contact time of the aqueous treatment solution with the coating 7 is between 2 seconds and 2 minutes.

Advantageously, the aqueous treatment solution is applied under conditions of temperature, contact time with the coating 7 and concentration of $Cl^-$ ions adjusted to form a layer 13 that has a chlorine coating weight between 8 and 60 mg/m2.

Preferably, the aqueous treatment solution used for this first embodiment comprises zinc chloride. The selection of zinc as a cation makes it possible to prevent the presence of sodium or potassium, which are likely to form water-soluble compounds in the layer of zinc hydroxychloride. Preferably, the aqueous treatment solution contains between 10 and 80 g/L of zinc chloride $ZnCl_2$, corresponding to a concentration of $Cl^-$ ions between 0.14 and 1.2 mol/L. It has also been found that, in this range of concentrations, the rate of deposition is little influenced by the value of the concentration.

Preferably, the aqueous treatment solution used for this first embodiment does not comprise any chloride salt other than zinc chloride and/or magnesium chloride. The absence of chloride salts other than zinc chloride and/or magnesium chloride makes it possible to prevent the presence of sodium, potassium, calcium and other cations that form residual water-soluble compounds in the layer of zinc hydroxychloride and consequently alter the resistance to blackening/tarnishing and the resistance to corrosion of the metal sheet 1. Therefore, the layer 13 formed does not comprise, in particular, any residual water-soluble compounds of sodium chloride, contrary to what is observed on coatings 7 exposed to a corrosive atmosphere in a natural environment or under accelerated conditions.

In one variant of this embodiment, the aqueous treatment solution contains an oxidizing agent for zinc such as hydrogen peroxide. This oxidizing agent can have a very significant accelerator effect in low concentrations. It has been found that the addition of only 0.03%, i.e. $8 \cdot 10^{-3}$ mol/L of hydrogen peroxide, or of $2 \cdot 10^{-4}$ mol/L of potassium permanganate to the solution makes it possible to (approximately) double the rate of deposition. On the contrary, it has been found that concentrations 100 times greater do not achieve any further improvement in the rate of deposition.

After application of the aqueous treatment solution and before drying, the layer 13 deposited is adherent. The drying is adjusted to eliminate the residual water from the deposit.

Between the application step and the drying step, the metal sheet 1 is preferably rinsed to eliminate the soluble portion of the deposit obtained. The absence of rinsing and the partly water-soluble deposit that results are not very prejudicial to the corrosion resistance during storage, provided that the deposit obtained does in fact comprise a layer 13 that is insoluble in water (which is made possible by the simonkolleite) and does not comprise any residual water-soluble compound of sodium or potassium.

In a second embodiment of the method to obtain the layer 13, the aqueous treatment solution is applied over the coating 7 under anodic polarization.

In this case, the pH of the aqueous treatment solution is between 7 and 10. If the pH of the solution is less than 7, there is no formation of hydroxychlorides that adhere to the surface to be treated. If the pH of the solution is greater than 10, the hydroxychloride re-dissolves and/or decomposes.

Preferably, the aqueous treatment solution is applied to the coating 7 by adjusting the quantity of electrical charges circulating during the treatment so that the layer 13 has a chlorine coating weight greater than or equal to 1 mg/m$^2$.

Preferably, the charge density applied is between 10 and 100 C/dm$^2$ of surface to be treated.

Preferably, the deposition of the layer 13 must be conducted under a high polarization current density, in particular greater than 20 A/dm$^2$ and, for example, of 200 A/dm$^2$.

A titanium cathode can be used as the counter-electrode.

The temperature of the aqueous treatment solution is generally between 20° C. and 60° C., preferably, the method is carried out at a temperature greater than or equal to 40° C., to increase the conductivity of the solution and to decrease ohmic losses.

After formation of the layer 13 according to this other embodiment, the treated surface is rinsed with abundant quantities of demineralized water. This rinsing step makes it possible to eliminate the alkaline reagents on the surface of the deposit, which could cause corrosion problems. This rinsing also makes it possible to remove from the layer 13 any residual water-soluble salts of calcium, potassium, or any other cation associated with the chloride ions in the composition of the aqueous treatment solution. This rinsing also makes it possible, in this second embodiment, to not limit the nature of the chloride salt(s) used in the treatment solution.

In the framework of both of these embodiments of the layer 13, the application of the aqueous treatment solution on the coating 7 is preferably conducted when the substrate 3 coated with the coating 7 is in motion in the form of a moving strip. In particular, the application is carried out at the exit of the galvanizing line or at the exit of the vacuum deposition line, preferably between the skin pass step and coiling. The implementation of the treatment method on a moving metallic strip has the advantage of protecting the coating 7 from the moment of its fabrication and before it is exposed to various environments.

After the application of the layer 13 according to one of the embodiments described above, the layer 13 of the metal sheet 1 can optionally be lubricated.

This lubrication can be provided by applying a film of oil (not shown) with a coating weight of less than 2 g/m$^2$ to the layer 13.

To illustrate the invention, tests have been conducted and will be described below on the basis of non-limiting examples.

Cold rolled steel sheets 0.7 mm thick were previously coated by hot dip galvanizing with a coating 7 approximately 7 μm thick and comprising approximately 3% by weight of magnesium and approximately 3.7% by weight of aluminum, the balance being zinc and the unavoidable impurities.

Two aqueous treatment solutions were applied by centrifugal coating at room temperature on the coated sheets. The first solution contained 19.1 g/L of zinc chloride $ZnCl_2$. The second solution contained 19.1 g/L of zinc chloride and 3 g/L of magnesium sulfate heptahydrate. For purposes of comparison, some of the coated sheets were not treated.

The contact time was approximately 15 seconds and the weight of the chlorine layer obtained was approximately 42 mg/m$^2$, measured by x-ray fluorescence spectroscopy.

Some of the treated and untreated coated sheets were finally oiled with Quaker® 6130 oil with a coating weight of approximately 1 g/m$^2$.

The temporary protection of the sheets was evaluated via an aging test in natural exposure under shelter as specified by VDA 230-213 standard (duration of test 12 weeks). It was found that tests performed in a humidity and temperature controlled corrosion-test chamber did not make it possible to reproduce the tarnishing phenomenon observed under natural storage conditions.

During the test, the evolution of the tarnishing was monitored using a colorimeter by measuring the difference in luminance (measurement of $\Delta L^*$). The threshold value of $|\Delta L^*|$ corresponding to the appearance of tarnishing was set at 3.

Figure 2:
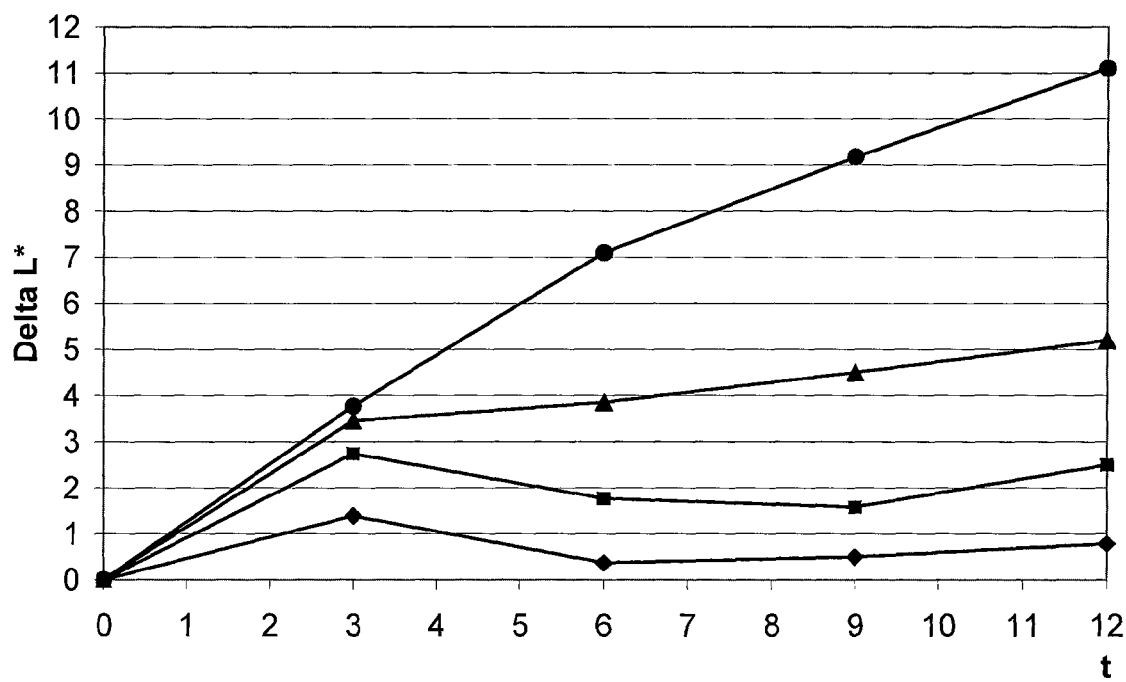
FIG. 2 presents curves illustrating the results of aging tests in natural exposure under shelter performed on different metal sheet test pieces treated with a first solution according to the invention or untreated.
Figure 3:
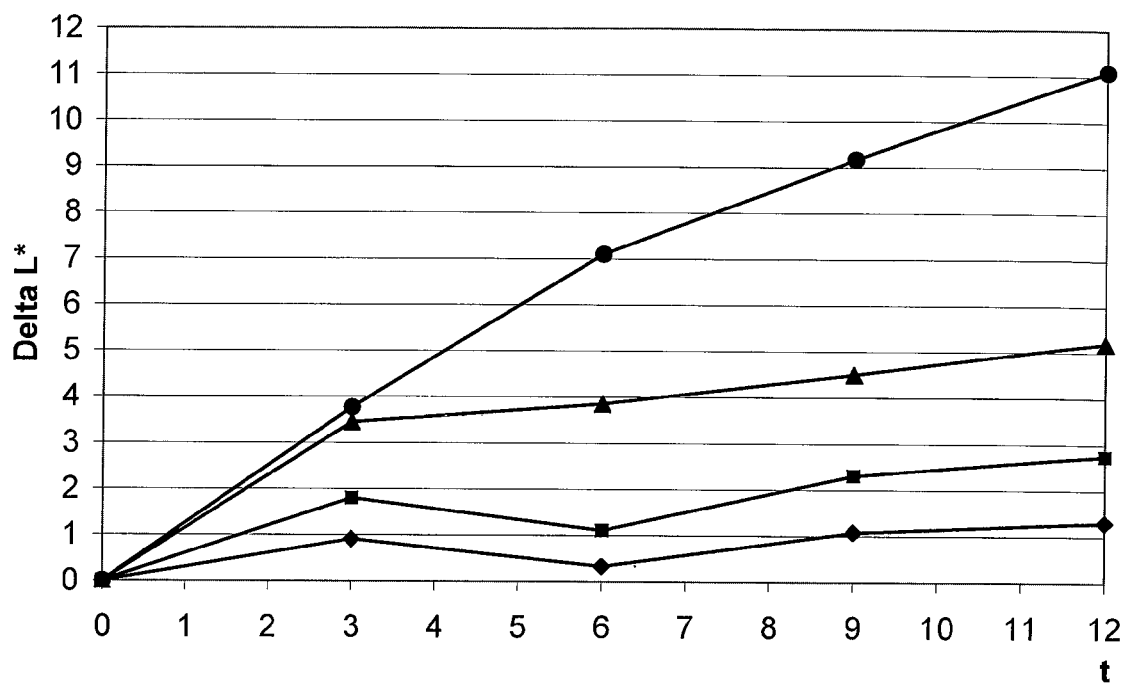
FIG. 3 presents curves illustrating the results of aging tests in natural exposure under shelter performed on different metal sheet test pieces treated with a second solution according to the invention or untreated.

The results obtained with the first treatment solution and the second treatment solution are presented respectively in FIGS. 2 and 3, where the time in weeks is plotted on the x-axis and the evolution of $\Delta L^*$ is plotted on the y-axis.

The different curves are identified by the following symbols in each of the FIGS. 2 and 3:
● : Sheet without layer 13, un-oiled,
▲ : Sheet without layer 13 but oiled,
■ : Sheet with layer 13 and oiled,
♦ : Sheet with layer 13, un-oiled.

These results show the advantage of the layers 13 for temporary protection against the tarnishing of coatings 7 that comprise zinc, magnesium and aluminum, because all of the sheets with a layer 13 exhibit a tarnishing kinetic that is delayed compared to sheets without a layer 13, whether the layer 13 is oiled or not.

Although the invention has been described above for use in the automotive industry, it goes without saying that it is not limited to this field, and that it can be used for any steel part, regardless of its final intended use.

What is claimed is:

1. A method for a moving metal strip comprising the steps of:
providing a strip of steel with a coating on at least one face, the coating including from 0.1 to 20% by weight of magnesium, a balance being zinc and impurities linked to the method; and
applying an aqueous treatment solution to the coating by simple contact to form a layer, the aqueous treatment solution including at least 0.01 mol/L of zinc chloride and neither sodium chloride nor potassium chloride; the layer including zinc hydroxychloride, the layer having a chlorine coating weight of at least 1 mg/m$^2$, and the layer being free of hydrozincite and mixed hydroxycarbonates of zinc and aluminum.

2. The method according to claim 1, wherein the coating includes from 0.1 to 20% by weight of aluminum.

3. The method according to claim 1, wherein the coating includes one or more additional elements selected from among Si, Sb, Pb, Ti, Ca, Mn, Sn, La, Ce, Cr, Ni, Zr and Bi, the content by weight of each additional element being less than 0.3%.

4. The method according to claim 1, further comprising the step of:
  drying subsequent to the application of the aqueous treatment solution.

5. The method according to claim 1, wherein the aqueous treatment solution includes $Mg^{2+}$ ions in a concentration between $5 \cdot 10^{-5}$ and 0.25 mol/L.

6. The method according to claim 5, wherein the $Mg^{2+}$ ions are added to the aqueous solution in the form of magnesium chloride.

7. The method according to claim 1, wherein the aqueous treatment solution may include zinc chloride or magnesium chloride, and is free of other chloride salts.

8. The method according to claim 1, wherein the aqueous treatment solution further comprises magnesium chloride.

9. The method according to claim 1, wherein the temperature of the aqueous treatment solution is between 20° and 60° C.

10. The method according to claim 1, wherein the pH of the aqueous treatment solution is from 4 to 7.

11. The method of claim 1, wherein the aqueous treatment solution is applied when the strip of steel with the coating is moving.

12. The method of claim 1, wherein the chlorine coating weight of the layer is less than 70 mg/m$^2$.

13. The method of claim 1, wherein the chlorine coating weight of the layer is from 8 to 60 mg/m$^2$.

14. The method according to claim 1, wherein the aqueous treatment solution further comprises an oxidizing agent.

15. The method according to claim 1, wherein the aqueous treatment solution is applied under anodic polarization.

16. The method of claim 1, wherein a contact time of the aqueous treatment solution with the coating is between 2 seconds and 2 minutes.

17. The method of claim 1, wherein the aqueous treatment solution further comprises hydrogen peroxide.

18. The method of claim 1, wherein the aqueous treatment solution is applied at an exit of a galvanizing line or an exit of a vacuum deposition line.

19. The method of claim 1, wherein the aqueous treatment solution is applied between a skin pass and a coiling of said strip of steel with the coating.

20. The method of claim 1, wherein the aqueous treatment solution is applied by centrifugal coating.

21. The method of claim 1, wherein the layer is distributed uniformly over the surface of the coating.

* * * * *